(12) United States Patent
Davis et al.

(10) Patent No.: US 7,324,421 B1
(45) Date of Patent: Jan. 29, 2008

(54) METHOD AND APPARATUS FOR DATA BIT ALIGN

(75) Inventors: Barry Allen Davis, Union City, CA (US); Walter F. Bridgewater, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 1167 days.

(21) Appl. No.: 10/218,313

(22) Filed: Aug. 13, 2002

(51) Int. Cl.
*G11B 11/00* (2006.01)

(52) U.S. Cl. .................... 369/53.34; 375/371

(58) Field of Classification Search ............ None
See application file for complete search history.

(56) References Cited

U.S. PATENT DOCUMENTS

| | | | |
|---|---|---|---|
| 4,700,347 A * | 10/1987 | Rettberg et al. ............ 714/700 |
| 4,723,243 A * | 2/1988 | Joshi et al. ................. 714/776 |
| 5,157,530 A * | 10/1992 | Loeb et al. .................. 398/79 |
| 5,245,637 A * | 9/1993 | Gersbach et al. ............ 375/374 |
| 5,778,214 A * | 7/1998 | Taya et al. ................... 713/400 |
| 5,793,549 A * | 8/1998 | Alon et al. ............... 369/53.34 |
| 5,793,822 A * | 8/1998 | Anderson et al. ........... 375/371 |
| 6,031,847 A * | 2/2000 | Collins et al. .............. 370/508 |
| 6,108,794 A * | 8/2000 | Erickson ..................... 713/401 |
| 6,288,656 B1* | 9/2001 | Desai ........................ 341/100 |
| 6,704,882 B2* | 3/2004 | Zabinski et al. ........... 713/401 |
| 6,915,462 B1* | 7/2005 | Davis et al. ................ 714/700 |

* cited by examiner

*Primary Examiner*—Huy D. Vu
*Assistant Examiner*—Phuongchau B Nguyen
(74) *Attorney, Agent, or Firm*—Martine Penilla & Gencarella, LLP

(57) ABSTRACT

An invention is provided for data bit align. The invention includes a multiplexer that receives a data sample word as data input and also receives a clock sample word as select input. The multiplexer selects a data bit from the data sample word based on the clock sample word. Generally, the multiplexer can select the data bit from the data sample word corresponding to a position of the clock edge in the clock sample word. The invention also includes an output register, which is coupled to the multiplexer. The output register stores the selected data bit from the multiplexer and provides the selected data bit to remaining system components.

20 Claims, 6 Drawing Sheets

METHOD AND APPARATUS FOR DATA BIT ALIGN

CROSS REFERENCE TO RELATED APPLICATIONS

This application is related to (1) U.S. patent application Ser. No. 10/209,494, filed on Jul. 30, 2002, entitled "Apparatus And Method For Programmable Dual Stage Digital Filter," and (2) U.S. patent application Ser. No. 10/209,552, filed on Jul. 30, 2002, entitled "Method and Apparatus for a Programmable Deskew Circuit," each of which is hereby incorporated by reference in its entirety.

BACKGROUND OF THE INVENTION

1. Field of the Invention

This invention relates generally to data communications and more particularly to deskewing circuits for deskewing multiple pipelined signals.

2. Description of the Related Art

Personal computers (PCs) have gained widespread use in recent years primarily because they are inexpensive and yet powerful enough to handle computationally intensive user applications. The data storage and data sharing capabilities of PCs are often expanded by coupling a group of such computers to peripheral devices such as disk drives, tape drives, and printers. These peripheral devices and the personal computers are interconnected through a single communications network, such as a local area network.

The Small Computer System Interface (SCSI) standard, which is specified by the American National Standards Institute (ANSI X3.131-1986, which is incorporated herein by reference in its entirety) of 1430 Broadway, New York, N.Y. 10018, is an example of an industry-recognized standard for a relatively complex local area network. Descriptions of the SCSI bus may be found for example in U.S. Pat. No. 4,864,291 "SCSI Converter" issued Sep. 5, 1989 to J. E. Korpi and in U.S. Pat. No. 4,905,184 "Address Control System for Segmented Buffer Memory" issued Feb. 27, 1990, to R. P. Giridhar, et al., which are incorporated herein by reference in their entirety.

Using a SCSI network, bit information can be sent from target to target in a serial manner. Generally, data is transmitted along SCSI data lines using analog signal pulses. Upon receiving the signal pulses, the analog signals are converted to digital bits for digital signal processing. However, in addition to sampling input data, the constant clock signal used in accessing the data in subsequent processing is also digitally sampled. Hence, instead of the constant clock being an analog signal having rising and falling edges that can be used for data sampling, the sampled constant clock is a series of bits.

In view of the foregoing, there is a need for bit aligning circuits that provide a bit align mechanism for sampling data using a sampled constant clocked comprised of individual bits. Further, the bit align circuits should allow digital filtering, deskewing, and data reception for any clock speed.

SUMMARY OF THE INVENTION

Broadly speaking, the embodiments of the present invention address these needs by providing bit align for data channels based on a digitized clock signal. In one embodiment, an apparatus for data bit align is disclosed. The apparatus includes a multiplexer that receives a data sample word as data input and also receives a clock sample word as select input. The multiplexer then selects a data bit from the data sample word based on the clock sample word. In one aspect, the clock sample word indicates a position of a clock edge, which is indicated by a bit state in the clock sample word. For example, the position of a clock edge can be indicated by a TRUE bit value, such as by a bit having a value of "1." In these aspects, the multiplexer can select the data bit from the data sample word corresponding to the position of the clock edge in the clock sample word.

In another embodiment, a method is disclosed for providing data bit align. A data sample word comprising a plurality of data bits and a clock sample word comprising a plurality of clock bits are received. A position of a clock edge within the clock sample word is determined when the clock edge is present in the clock sample word. A data bit is then selected from the data sample word based on the position of the clock edge within the clock sample word when the clock edge is present in the clock sample word. As above, clock bits having a value of TRUE can indicate a clock edge. Hence, when a clock edge is not present in the clock sample word, the clock sample word can comprise all bits having a value of FALSE. Generally, remaining system components can ignore the selected data bit when the clock edge is not present in the clock sample word.

A system for data bit align is disclosed in a further embodiment of the present invention. The system includes a multiplexer that receives a data sample word as data input and also receives a clock sample word as select input. The multiplexer selects a data bit from the data sample word based on the clock sample word. The system also includes an output register, which is coupled to the multiplexer. The output register stores the selected data bit from the multiplexer and provides the selected data bit to remaining system components. As above, the multiplexer can select the data bit from the data sample word corresponding to a position of the clock edge in the clock sample word. In addition, remaining system components can ignore data bits stored in the output register when the clock sample word comprises only bits having a value of "0." Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a bit align circuit that can be utilized in any circuit to allow digital filtering, deskewing, and data reception for any clock speed. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
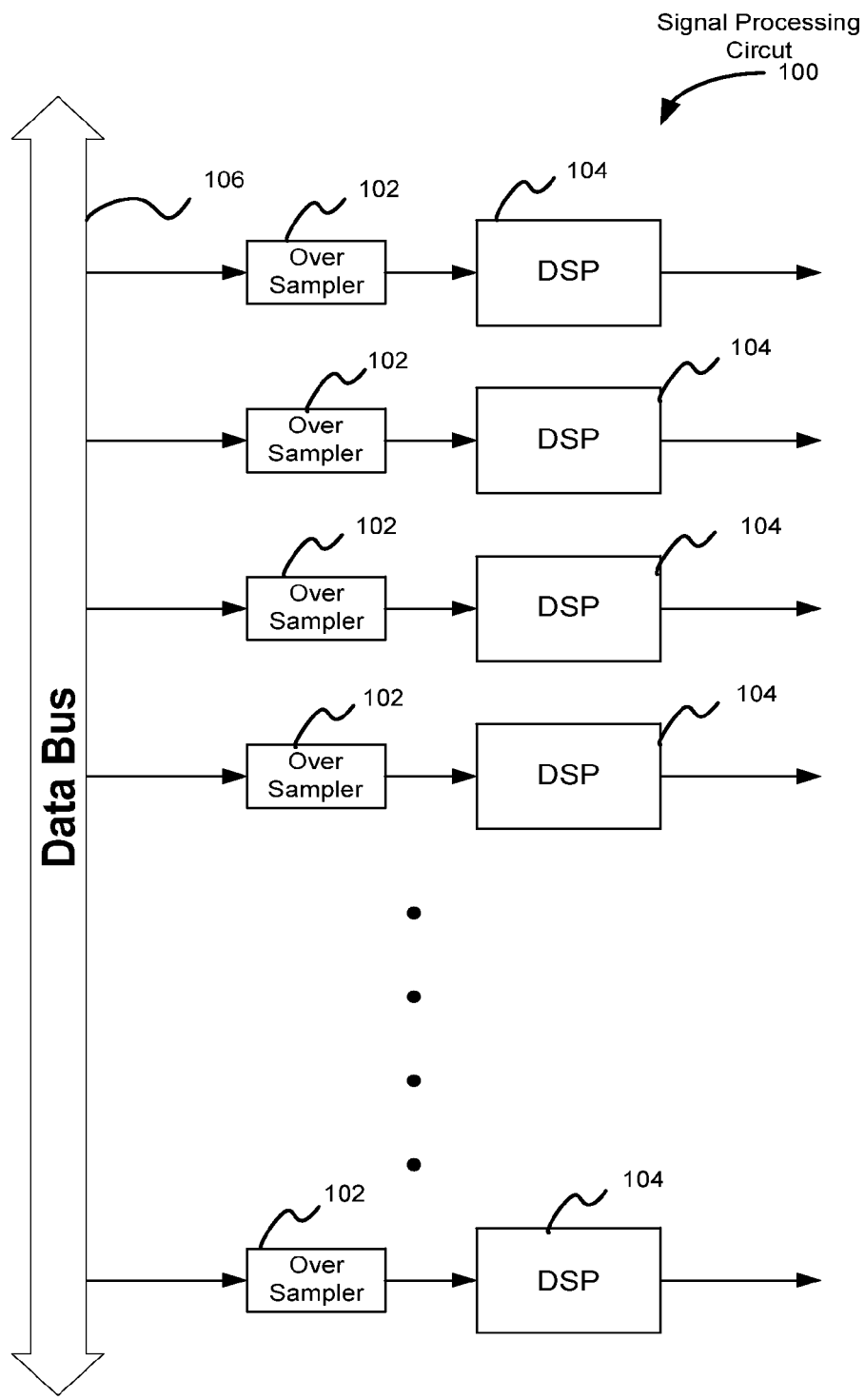
FIG. 1 is a block diagram showing a signal processing circuit, in accordance with an embodiment of the present invention.

FIG. 1 is a block diagram showing a signal processing circuit 100, in accordance with an embodiment of the present invention. The signal processing circuit 100 includes a plurality of over samplers 102, each receiving an input signal bit stream from a data bus 106. As described in greater detail subsequently, each over sampler 102 provides a parallel bit sample staggered in time to a corresponding digital signal processor (DSP) 104 for further processing.

The over samplers 102 and DSPs 104 form a plurality of data channels, each processing a single bit stream from the data bus 106. As described in greater detail subsequently, the over samplers 102 are adapted to operate at a specified frequency and sample the input signals at a higher clock frequency to generate sets of N parallel bit samples staggered in time. However, in addition to sampling input data, the over samplers 102 also sample the constant clock signal used in accessing the data in subsequent processing. Hence, instead of the constant clock being an analog signal having rising and falling edges that can be used for data sampling, the sampled constant clock is a series of bits. Embodiments of the present invention provide a bit align mechanism for sampling data using a sampled constant clocked comprised of individual bits. Although, the embodiments of the present invention are shown using a data bus 106, over samplers 102, and other system elements, it should be noted that the embodiments of the present invention can be utilized in any circuit to allow digital filtering, deskewing, and data reception for any clock speed.

Figure 2:
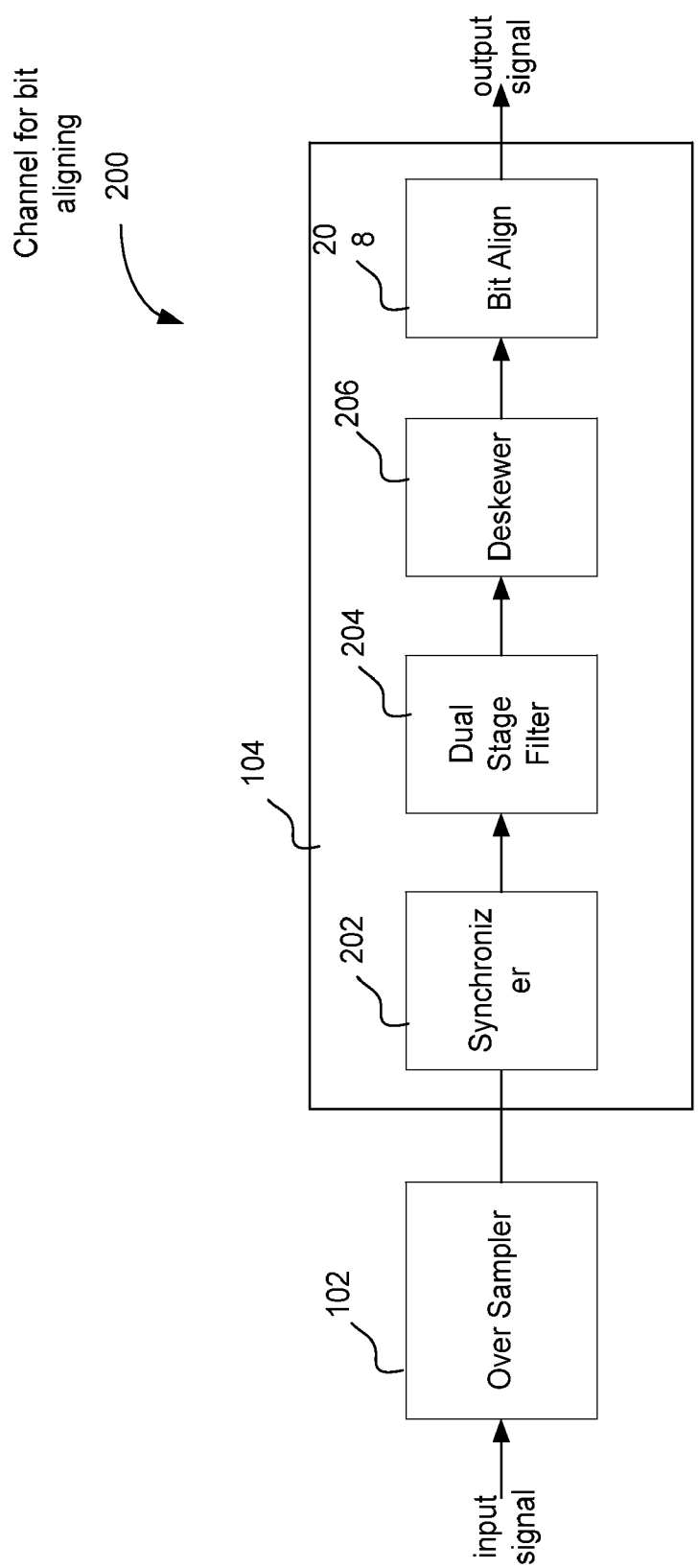
FIG. 2 shows an overview block diagram of a channel for deskewing an input signal bit stream in accordance with one embodiment of the present invention.

FIG. 2 shows an overview block diagram of a channel 200 for bit aligning an input signal bit stream using a sampled constant clock in accordance with one embodiment of the present invention. The channel 200 includes an over sampler 102 and a DSP 104. The over sampler 102 receives the input signals that are adapted to operate at a specified frequency and samples the input signals at a higher clock frequency to generate sets of N parallel bit samples staggered in time, where N can be any suitable integer number greater than 1. For example, the over sampler 102 may sample an input signal adapted to operate at 80 Mhz at 3.2 Ghz to generate groups of 8 parallel bit (i.e., a byte) sample data with each bit sample being staggered in time. It should be noted that the channel 200 processes a signal on a single line, such as a single SCSI line. As such, when used in conjunction with SCSI buses, a channel 200 may be provided for each SCSI line, such as data, ACK, REQ, P1 (parity 1), and P0 (parity 0) lines.

The DSP 104 includes a synchronizer 202, a dual stage filter 204, a deskewer 206, and a bit align unit 208 for processing the N parallel bit data samples. The synchronizer 202 is coupled to receive the N bit sample data from the over sampler 102 and synchronizes the data samples to an external clock that operates, for example, at 400 Mhz. The synchronizer 202 may be implemented using a four-byte rollover FIFO where incoming data is written into successive stages of the FIFO. The synchronizer 202 outputs a 14-bit word by using a shift register for input to the dual stage filter 204. The 14-bit output word from the synchronizer 202 includes eight bits of current sample byte and the last six bits of the previous sample byte.

The dual stage filter 204 is coupled to receive the 14-bit word from the synchronizer 202 and filters both one bit noise and burst noise to output a 16-bit output data. The deskewer 206 is coupled to the dual stage filter 204 to receive the filtered 16-bit data from the dual stage filter 204 and deskews any signal discrepancies of the DSP 104 with other DSPs. The deskewer 206 then outputs the deskewed and filtered data, using 8-bit data words, to the bit align unit 208, which aligns the output data with data in other DSPs.

Figure 3:
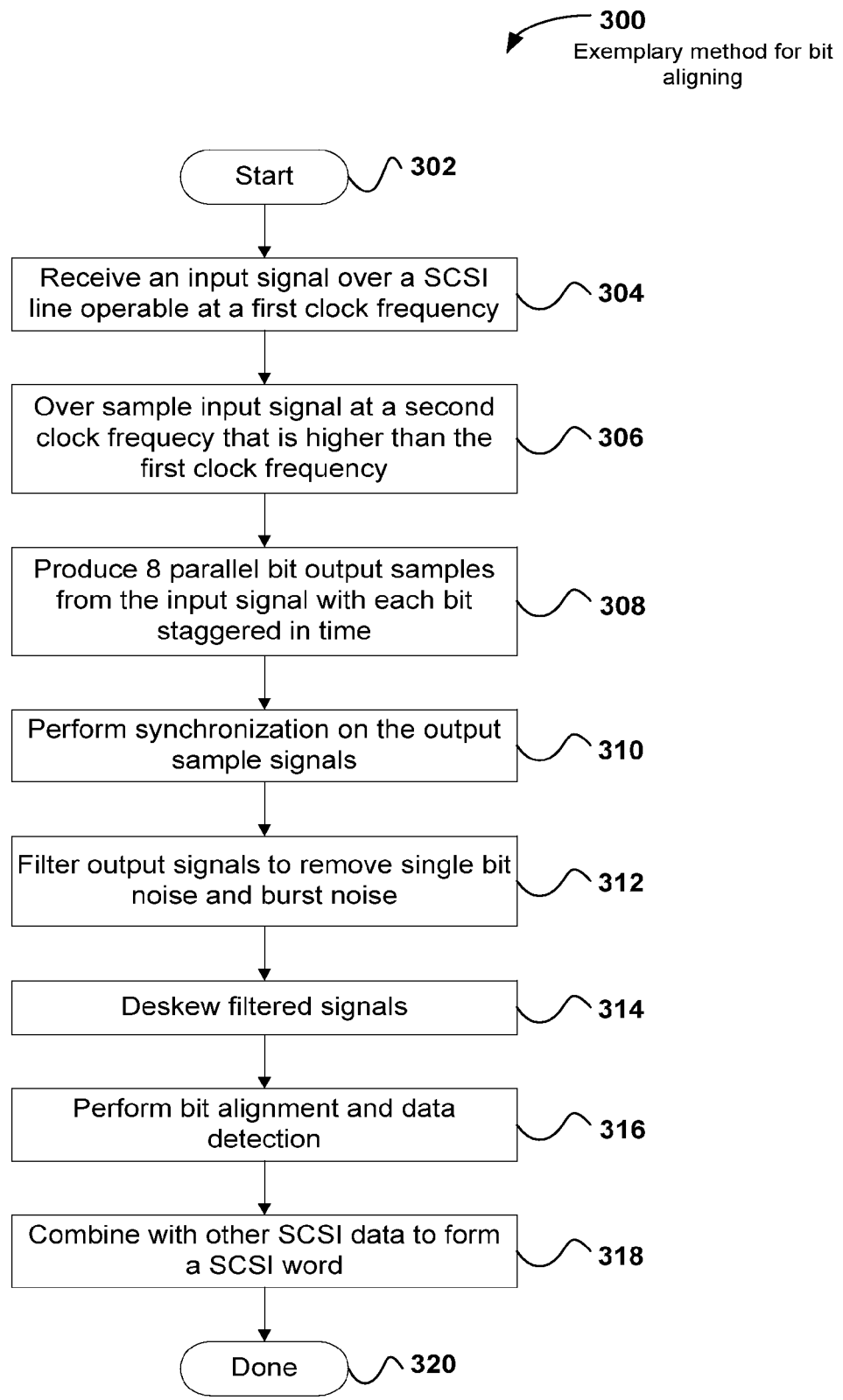
FIG. 3 is a flowchart showing an exemplary method for deskewing an input data bit stream in accordance with one embodiment of the present invention.

FIG. 3 is a flowchart showing an exemplary method 300 for bit aligning an input signal bit stream using a sampled constant clock in accordance with one embodiment of the present invention. In this embodiment, the method 300 illustrates a bit align of a single bit stream of data on a single SCSI bus line. However, those skilled in the art will appreciate that the method 300 is equally applicable to other data or control lines that require bit aligning. In an initial operation 302, preprocess operations are performed. Preprocess operations can include provisioning transmission hardware, transmitting data along a SCSI line, and other preprocess operations that will be apparent to those skilled in the art.

An input bit signal is received in operation 304 over a SCSI line that is adapted to operate at 80 Mhz. As mentioned previously, the input bit signal is received on as signal on a single line, such as a single SCSI line. As such, when used in conjunction with SCSI buses, an input bit signal is received for each SCSI line, such as data, ACK, REQ, P1 (parity 1), and P0 (parity 0) lines.

The input signal then is over sampled in operation 306 at a second clock frequency (e.g., 3.2 Ghz) that is higher than the first clock frequency to ensure generation of N parallel bit samples. An eight parallel bit sample is then generated using the sampled data, in operation 308. Each of the N parallel bit samples is staggered in time. Then in operation 310, N parallel bit samples are synchronized and output along with the last M bits from the previous bit samples to form N+M output bits. For example, 8 parallel bit samples and the last 6 bits from previous bit samples may be output as a 14-bit word.

The N+M output bits are then filtered to remove a single bit noise and burst noise in operation 312 to output an N-bit filtered word. The N-bit word is then deskewed in operation 314. During the deskewing operation 314, the N-bit word can be delayed on fast data channels to match the data on slower data channels. The N bits are then aligned and data detection performed to generate a single SCSI bit signal in operation 316. Finally, the single SCSI bit is combined with other SCSI data to form a SCSI word in operation 318. Post process operations are performed in operation 320. Post process operations can include further signal processing, signal usage, and other post process operations that will be apparent to those skilled in the art.

Figure 4:
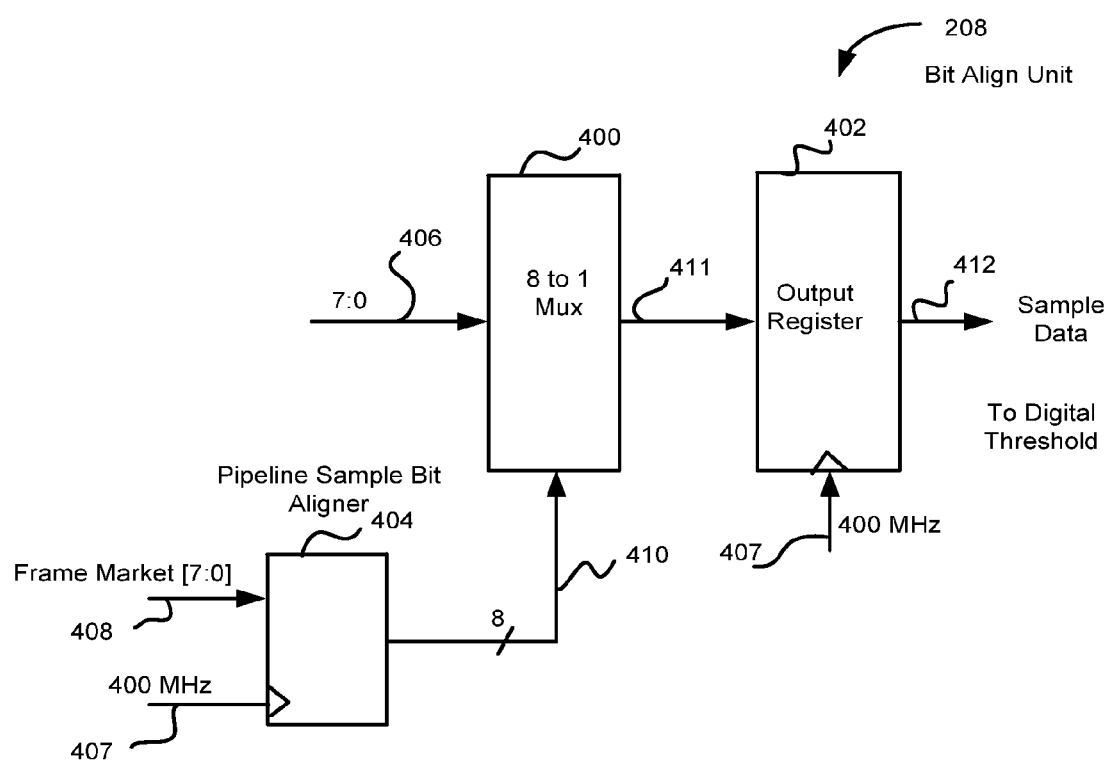
FIG. 4 is a schematic diagram showing a bit align unit, in accordance with an embodiment of the present invention.

FIG. 4 is a schematic diagram showing a bit align unit 208, in accordance with an embodiment of the present invention. The bit align unit 208 includes an 8-to-1 multiplexer 400 coupled to an output register 402. In addition, a pipeline sample word aligner 404 is coupled to the select inputs of the 8-to-1 multiplexer 400. Time frame aligned data samples 406 are provided as inputs to the 8-to-1 multiplexer 400, and eight bit time frame aligned clock samples 408 are provided as data inputs to the pipeline sample word aligner 404. Both the pipeline sample word aligner 404 and the output register 402 are clocked using an internal clock 407.

In operation, the 8-to-1 multiplexer 400 receives the input data stream for the channel as an eight bit time frame aligned data sample 406. Generally, the time frame aligned data sample 406 is deskewed with respect to other data channels using the deskewer 206. Additional deskewing information can be found in U.S. patent application Ser. No. 10/209,552, entitled "Method and Apparatus for a Programmable Deskew Circuit, filed on Jul. 30, 2002, which is incorporated herein by reference in its entirety. Hence, the time frame aligned data sample 406 comprises eight bits of data sampled from the input data stream using the over sampler.

In addition, the pipeline sample word aligner 404 receives an eight bit time frame aligned clock sample 408, which is also deskewed with respect to the other data channels using the deskew 206. However, in one embodiment, the time frame aligned clock sample 408 is slightly delayed so as to trigger sampling in the middle of a time frame aligned data sample 406. This delay can be inserted via the deskewer 206, the pipeline sample word aligner 404, or using some other circuit element as will be apparent to those skilled in the art.

The time frame aligned clock sample 408 is an edge detected clock comprising eight bits, wherein a value of "1" is used to indicate a clock transition, and a value of "0" is used to indicate no transition. Since a clock pulse of the constant clock generally comprises multiple clock sample words, each time frame aligned clock sample 408 generally will have at most one bit having a value of "1" indicating a clock transition. When a clock sample does not include a clock transition, the time frame aligned clock sample 408 comprises eight bits, each having a value of "0."

The pipeline sample word aligner 404 can be used to keep the time frame aligned clock sample 408 in synchronization with the time frame aligned data sample 406. However, it should be noted that in some embodiments synchronization assistance is not needed. In these embodiments, the pipeline sample word aligner 404 can be omitted.

Each internal clock cycle, the pipeline sample word aligner 404 provides the time frame aligned clock sample 408 to the 8-to-1 multiplexer 400 as select inputs 410. As mentioned previously, the 8-to-1 multiplexer 400 receives the time frame aligned data sample 406 as an eight bit data input. The time frame aligned clock sample 408 is used to select a bit from the time frame aligned data sample that corresponds to the transition bit position having a value of "1" in the time frame aligned clock sample 408. For example, if a particular time frame aligned clock sample 408 comprises an eight bit clock sample having a "1" in bit position three, the 8-to-1 multiplexer 400 selects the bit in the time frame aligned data sample 406 at bit position three. The value of this bit is then provided to the output register 402 as the selected data bit 411. The output register 402 stores the selected data bit 411 as the sample data bit 412 and provides the sample data bit 412 to the remainder of the system during the following cycle of the internal clock 407.

When the time frame aligned clock sample 408 comprises all "0" bits, a "NULL" value is stored in the output register. In this case, the remainder of the system will not use the value stored in the output register during the subsequent clock cycle. In this case, the system will ignore the sample data bit 412, since the value of the sample data bit 412 will not have meaning.

Figure 5:
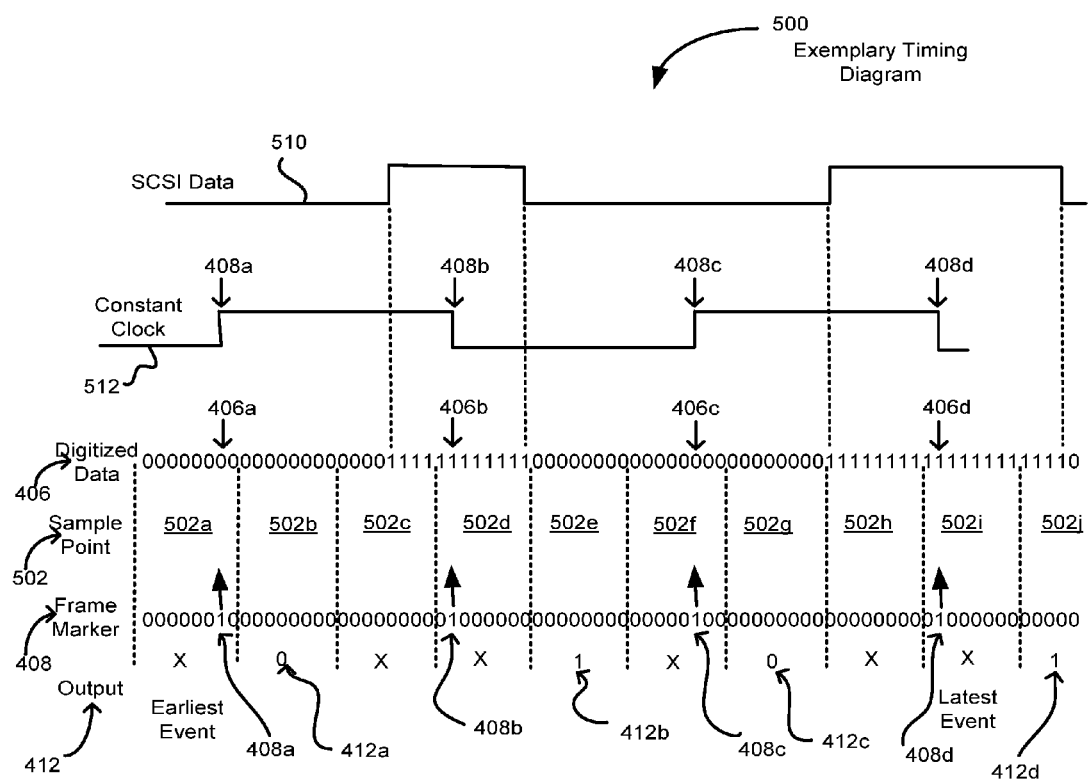
FIG. 5 is an exemplary timing diagram showing the signals utilized by the bit align unit, in accordance with an embodiment of the present invention.

FIG. 5 is an exemplary timing diagram 500 showing the signals utilized by the bit align unit 208, in accordance with an embodiment of the present invention. The timing diagram 500 shows both analog and digital versions of the data and constant clock signals utilized by the embodiments of the present invention. The serial data stream 510 corresponds to the time frame aligned data sample 406, which is a digitized version of the data in the serial data stream 510. In particular, the time frame aligned data sample 406 comprises a sequence of eight bit sample words, wherein bits corresponding to a high signal are set to a value of "1" and bits corresponding to a low signal are set to a value of "0." Similarly, the constant clock signal 512 corresponds to the time frame aligned clock sample 408, which is a digitized version of the data in the constant clock signal 512. Specifically, the time frame aligned clock sample 408 comprises a sequence of eight bit sample words, wherein bits corresponding to a clock transition are set to a value of "1" and all remaining bits are set to a value of "0."

As mentioned previously, embodiments of the present invention provide a bit align mechanism for sampling data using the sampled constant clocked comprised of individual bits of the time frame clock samples 408. In particular, the time frame aligned data samples 406 and the time frame aligned clock samples 408 are received in groups of eight bits during sample word frames 502a-502j using the internal clock 407. During each sample word frame 502a-502j, an eight bit time frame aligned data sample 406 and an eight bit time frame aligned clock sample 408 are received by the bit align unit 208.

The time frame aligned clock sample 408 is an edge detected clock comprising eight bits, wherein a value of "1" is used to indicate a clock transition, and a value of "0" is used to indicate no transition. Hence, during each sample word frame 502, embodiments of the present invention examine the clock sample 408 to determine whether a bit having a value of "1" is present in the clock sample 408. If the time frame aligned clock sample 408 includes a bit having a value of "1," the corresponding bit in the time frame aligned data sample 406 is provided to the output register 402. Otherwise, a "NULL" value is provided to the output register 402. The value stored in the output register 402 is then provided to the remainder of the system during the following sample word frame 502. However, when the value stored in the output register 402 is "NULL," the system does not use the stored value during that particular sample word frame 502.

For example, during sample word frame 502a the time frame aligned clock sample 408 includes a clock edge bit 408a having a value of "1" in the $7^{th}$ bit position. As a result, the value of the data bit 406a in the $7^{th}$ bit position of the time frame aligned data sample 406 is provided to the output register 402. In the example of FIG. 5 this value is "0."

Then, during sample word frame 502b, the output register 402 provides the value stored during sample word frame 502a to the remainder of the system as the sample data bit 412a. In addition, since a clock edge bit is not included in the time frame aligned clock sample 408, all the bits of the sample clock have a value of "0." As a result, a "NULL" value is provided to the output register 402. During sample word frame 502c, the output register 402 does not provide data to the system, since the value stored during sample word frame 502b was a "NULL" value. In addition, another "NULL" value is stored in the output register 402, since a clock edge bit is not included in the time frame aligned clock sample 408.

Next, during sample word frame 502d, the output register 402 again does not provide data to the system, since the value stored during sample word frame 502c was a "NULL" value. In addition, the time frame aligned clock sample 408 includes a clock edge bit 408*b* having a value of "1" in the 2 bit position. As a result, the value of the data bit 406*b* in the $2^{nd}$ bit position of the time frame aligned data sample 406 is provided to the output register 402. In the example of FIG. 5 this value is "1." During sample word frame 502*e*, the output register 402 provides the value "1," stored during sample word frame 502*d*, to the remainder of the system as the sample data bit 412*b*. In addition, since a clock edge bit is not included in the time frame aligned clock sample 408, a "NULL" value is provided to the output register 402.

During sample word frame 502*f*, the output register 402 again does not provide data to the system, since the value stored during sample word frame 502*e* was a "NULL" value. In addition, the time frame aligned clock sample 408 includes a clock edge bit 408*c* having a value of "1" in the $6^{th}$ bit position. As a result, the value of the data bit 406*c* in the $6^{th}$ bit position of the time frame aligned data sample 406 is provided to the output register 402. In the example of FIG. 5 this value is "0." During sample word frame 502*g*, the output register 402 provides the value "0," stored during sample word frame 502*f*, to the remainder of the system as the sample data bit 412*c*. In addition, since a clock edge bit is not included in the time frame aligned clock sample 408, a "NULL" value is provided to the output register 402.

Then, during sample word frame 502*h*, the output register 402 again does not provide data to the system, since the value stored during sample word frame 502*g* was a "NULL" value. In addition, since a clock edge bit is not included in the time frame aligned clock sample 408, a "NULL" value is provided to the output register 402. Next, during sample word frame 502*i*, the output register 402 again does not provide data to the system, since the value stored during sample word frame 502*h* was a "NULL" value. In addition, the time frame aligned clock sample 408 includes a clock edge bit 408*d* having a value of "1" in the $2^{nd}$ bit position. As a result, the value of the data bit 406*d* in the $2^{nd}$ bit position of the time frame aligned data sample 406 is provided to the output register 402. In the example of FIG. 5 this value is "1." Finally, during sample word frame 502*j*, the output register 402 provides the value "1," stored during sample word frame 502*i*, to the remainder of the system as the sample data bit 412*d*. In addition, since a clock edge bit is not included in the time frame aligned clock sample 408, a "NULL" value is provided to the output register 402. In this manner, the embodiments of the present invention can be utilized to allow digital filtering, deskewing, and data reception for any clock speed.

Figure 6:
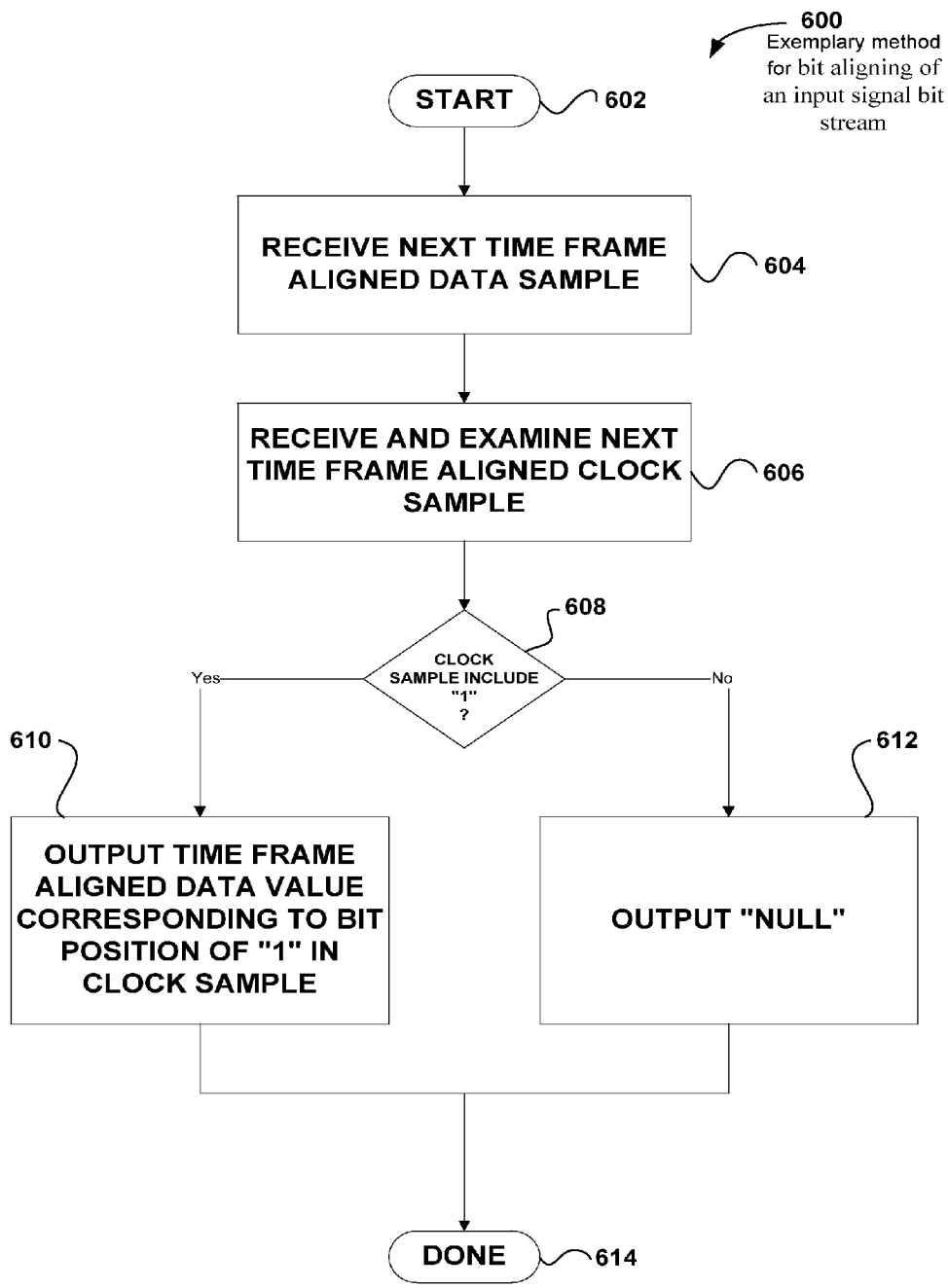
FIG. 6 is a flowchart showing a method for bit aligning an input signal bit stream using a sampled constant clock, in accordance with one embodiment of the present invention.

FIG. 6 is a flowchart showing a method 600 for bit aligning an input signal bit stream using a sampled constant clock, in accordance with one embodiment of the present invention. In an initial operation 602, preprocess operation are performed. Preprocess operations can include filtering and deskewing the input data stream, delaying the constant clock for data sampling, and other preprocess operations that will be apparent to those skilled in the art.

In operation 604, the next time frame aligned data sample is received. The 8-to-1 multiplexer of the bit align unit receives the input data stream for the channel as an eight bit time frame aligned data sample. Generally, the time frame aligned data sample is deskewed with respect to other data channels using the deskewer. Hence, the time frame aligned data sample comprises eight bits of data sampled from the input data stream by the over sampler and deskewed with respect to the other data channels using the deskewer.

In operation 606, the next time frame aligned clock sample is received and examined. The pipeline sample word aligner of the bit align unit receives the eight bit time frame aligned clock sample, which is also deskewed with respect to the other data channels using the deskew. In one embodiment, the time frame aligned clock sample is slightly delayed so as to trigger sampling in the middle of a time frame aligned data sample. This delay can be inserted via the deskewer, the pipeline sample word aligner, or using some other circuit element as will be apparent to those skilled in the art.

As mentioned above, the time frame aligned clock sample is an edge detected clock comprising eight bits, wherein a value of "1" is used to indicate a clock transition, and a value of "0" is used to indicate no transition. Since a clock pulse of the constant clock generally comprises multiple clock sample words, each time frame aligned clock sample generally has at most one bit having a value of "1" indicating a clock transition. When there are no clock transitions present in a clock sample, the time frame aligned clock sample comprises eight bits, each having a value of "0." The pipeline sample word aligner can be used to keep the time frame aligned clock sample in synchronization with the time frame aligned data sample. However, it should be noted that in some embodiments synchronization assistance is not needed. In these embodiments, the pipeline sample word aligner can be omitted.

A decision is then made as to whether the time frame aligned clock sample includes a bit having a value of "1," in operation 608. The constant clock signal corresponds to the time frame aligned clock sample, which is a digitized version of the data in the constant clock signal. Specifically, the time frame aligned clock sample comprises a sequence of eight bit sample words, wherein bits corresponding to a clock transition are set to a value of "1" and all remaining bits are set to a value of "0." Hence, during each sample word frame, embodiments of the present invention examine the clock sample to determine whether a bit having a value of "1" is present in the clock sample. If the time frame aligned clock sample includes a bit having a value of "1," the method 600 continues to operation 610. Otherwise, the method 600 branches to operation 612.

In operation 610, the time frame aligned clock sample is used to select a bit from the time frame aligned data sample. In particular, if the time frame aligned clock sample includes a bit having a value of "1," the corresponding bit in the time frame aligned data sample is provided to the output register of the bit align unit. For example, if the time frame aligned clock sample includes a clock edge bit having a value of "1" in the $7^{th}$ bit position, the value of the data bit in the $7^{th}$ bit position of the time frame aligned data sample is provided to the output register. The value stored in the output register is then provided to the remainder of the system during the following sample word frame.

In operation 612, a "NULL" value is placed in the output register. If the time frame aligned clock sample comprises all bits having a value of "0," a "NULL" value is provided to the output register. When the value stored in the output register is a "NULL" value, the system does not use the stored value during the subsequent sample word frame. Hence, the operation of storing a "NULL" in the output register can comprise storing any value in the output register, since the system will ignore any value stored in the output register during the subsequent internal clock cycle.

Post process operations are performed in operation 614. Post process operations can include providing a non-NULL value stored in the output register to the remainder of the system, combining data from the individual data channels, and other post process operations that will be apparent to those skilled in the art. Advantageously, the embodiments of the present invention can be utilized to allow digital filtering, deskewing, and data reception for any clock speed.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for data bit align, comprising:
   a pipeline sample word aligner for a time frame alignment of a clock sample word with a time frame alignment of a data sample word;
   a multiplexer that receives the data sample word, the data sample word including a plurality of data bits, as data input and that receives the clock sample word from the pipeline sample word aligner, the clock sample word including a plurality of clock bits wherein a bit state of one of the plurality of clock bits represents a clock edge, as select input,
   wherein the multiplexer selects a data bit from the plurality of data bits in the data sample word based on a position of the clock edge in the clock sample word, the data sample word and the clock sample word are of same size and if the clock sample word includes the clock edge, the selected data bit is a bit in the data sample word corresponding to a bit representing the clock edge in the clock sample word, and if the clock sample word does not include the clock edge, the selected data bit is NULL.

2. An apparatus as recited in claim 1, wherein the clock sample word indicates the position of the clock edge.

3. An apparatus as recited in claim 2, wherein the position of a clock edge is indicated by a bit state in the clock sample word.

4. An apparatus as recited in claim 3, wherein the position of a clock edge is indicated by a TRUE bit value.

5. An apparatus as recited in claim 4, wherein a TRUE bit value is indicated by a bit having a value of "1."

6. An apparatus as recited in claim 1, wherein the multiplexer selects a data bit from the data sample word based on a position of a clock edge in the clock sample word.

7. An apparatus as recited in claim 6, wherein the multiplexer selects the data bit from the data sample word corresponding to the position of the clock edge in the clock sample word.

8. An apparatus as recited in claim 7, wherein the clock edge is indicated by a bit having a value of "1" and remaining bits of the clock sample word have a value of "0."

9. An apparatus as recited in claim 1, further comprising an output register coupled to the multiplexer, the output register storing the selected data bit from the multiplexer and providing the selected data bit to remaining system components.

10. An apparatus as recited in claim 9, wherein remaining system components ignore data bits stored in the output register when the clock sample word comprises only bits having a value of "0."

11. A method for providing data bit align, comprising the operations of:
    receiving a data sample word comprising a plurality of data bits;
    receiving a clock sample word comprising a plurality of clock bits wherein a bit state of one of the plurality of clock bits represents a clock edge;
    determining a position of the clock edge within the clock sample word when the clock edge is present in the clock sample word; and
    selecting a data bit from the data sample word based on the position of the clock edge within the clock sample word when the clock edge is present in the clock sample word,
    wherein the data sample word and the clock sample word are of same size and if the clock sample word includes the clock edge, the selected data bit is a bit in the data sample word corresponding to a bit representing the clock edge in the clock sample word, and if the clock sample word does not include the clock edge, the selected data bit is NULL.

12. A method as recited in claim 11, wherein the bit state having a value of TRUE indicates the clock edge.

13. A method as recited in claim 12, wherein the clock sample word comprises all bits having a value of FALSE when a clock edge is not present in the clock sample word.

14. A method as recited in claim 13, further comprising the operation of selecting the data bit from the data sample word in the same bit position as the bit having a value of TRUE in the sample clock word when the clock edge is present in the clock sample word.

15. A method as recited in claim 11, further comprising the operation of providing the selected data bit to remaining system components when the clock edge is present in the clock sample word.

16. A method as recited in claim 15, wherein the remaining system components ignore the selected data bit when the clock edge is not present in the clock sample word.

17. A system for data bit align, comprising:
    a multiplexer that receives a data sample word, the data sample word including a plurality of data bits, as data input and that receives a clock sample word the clock sample word including a plurality of clock bits wherein a bit state of one of the plurality of clock bits represents a clock edge, as select input, wherein the multiplexer selects a data bit from the plurality of data bits in the data sample word based on a position of the clock edge in the clock sample word; and an output register directly coupled to the multiplexer, the output register storing the selected data bit from the multiplexer during an internal clock cycle and providing the selected data bit to remaining system components during the next internal clock cycle, wherein the data sample word and the clock sample word are of same size and if the clock sample word includes the clock edge, the selected data bit is a bit in the data sample word corresponding to a bit representing the clock edge in the clock sample word, and if the clock sample word does not include the clock edge, the selected data bit is NULL.

18. A system as recited in claim 17, wherein the multiplexer selects the data bit from the data sample word corresponding to a position of the clock edge in the clock sample word.

19. A system as recited in claim 18, wherein the clock edge is indicated by a bit having a value of "1" and remaining bits of the clock sample word have a value of "0."

20. A system as recited in claim 19, wherein remaining system components ignore data bits stored in the output register when the clock sample word comprises only bits having a value of "0."

* * * * *